(12) United States Patent
Choi

(10) Patent No.: US 10,056,846 B2
(45) Date of Patent: Aug. 21, 2018

(54) APPARATUS AND METHOD FOR INSULATION DESIGN OF HIGH VOLTAGE DIRECT CURRENT TRANSMISSION SYSTEM

(71) Applicant: LSIS CO., LTD., Anyang-si, Gyeonggi-do (KR)

(72) Inventor: Yong Kil Choi, Gunpo-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 475 days.

(21) Appl. No.: 14/696,021

(22) Filed: Apr. 24, 2015

(65) Prior Publication Data

US 2015/0333646 A1    Nov. 19, 2015

(30) Foreign Application Priority Data

May 13, 2014    (KR) ........................ 10-2014-0057376

(51) Int. Cl.
*H02M 5/44*     (2006.01)
*H02J 3/36*     (2006.01)
*G06F 17/50*    (2006.01)
*H02J 3/00*     (2006.01)

(52) U.S. Cl.
CPC ................ *H02M 5/44* (2013.01); *H02J 3/36* (2013.01); *G06F 17/50* (2013.01); *H02J 2003/007* (2013.01); *Y02E 60/60* (2013.01); *Y02E 60/76* (2013.01); *Y04S 40/22* (2013.01)

(58) Field of Classification Search
CPC ........ H02M 5/44; H02J 3/36; H02J 2003/007; G06F 17/50; Y02E 60/60; Y02E 60/76; Y04S 40/22
See application file for complete search history.

(56) References Cited

FOREIGN PATENT DOCUMENTS

| | | |
|---|---|---|
| CN | 102185307 | 9/2011 |
| JP | 2012014649 | 1/2012 |
| KR | 10-2012-0099393 | 9/2012 |
| KR | 10-1292856 | 8/2013 |
| KR | 101292856 | 8/2013 |
| KR | 101292856 B1 * | 8/2013 |

OTHER PUBLICATIONS

Fulchiron, D., "overvoltages and insulation coordination in MV and HV", Feb. 1995, Cahier Technique No. 151: Merlin Gerin, 1-24.*
European Patent Office Application Serial No. 15165334.2, Search Report dated Oct. 22, 2015, 7 pages.
Elahi, et al., "Insulation Coordination Process for HVDC Converter Stations: Preliminaty and Final Designs," IEEE Transactions on Power Delivery, IEEE Service Center, vol. 4, No. 2, Apr. 1989, XP000087345, pp. 1037-1948.

(Continued)

*Primary Examiner* — Jue Zhang
(74) *Attorney, Agent, or Firm* — K&L Gates LLP

(57) ABSTRACT

Provided is an apparatus for an insulation design. The apparatus for the insulation design, which performs the insulation design of a high voltage direct current (HVDC) transmission system includes a contingency state voltage calculation unit, a case analysis performance unit, and a rated insulation level calculation unit.

10 Claims, 6 Drawing Sheets

(56) References Cited

OTHER PUBLICATIONS

Nam, et al., "Development of Dynamic Models for DFIG Wind Farms and HVDC in Jeju Power System Using PSS/E," Trans. KIEE. vol. 60, No. 12, Dec. 2011, pp. 2183-2189.
State Intellectual Property Office of the People's Republic of China Application Serial No. 201510243508.9, Office Action dated Feb. 15, 2017, 9 pages.
Wang, B. et al., "RTDS Environment Development of Ultra-High-Voltage Power System and Relay Protection Test," IEEE Power Engineering Society General Meeting, Jun. 2007, 7 pages.
Elahi, H. et al., "Insulation Coordination Process for HVDC Converter Stations: Preliminary and Final Designs," IEEE Transactions on Power Delivery, Apr. 1989, 15 pages.
Han, L et al., "Verification of HVDC Controller Using an Advanced Hybrid Real_Time Simulator," IEEE Power System Technology, Aug. 1998, 5 pages.

\* cited by examiner

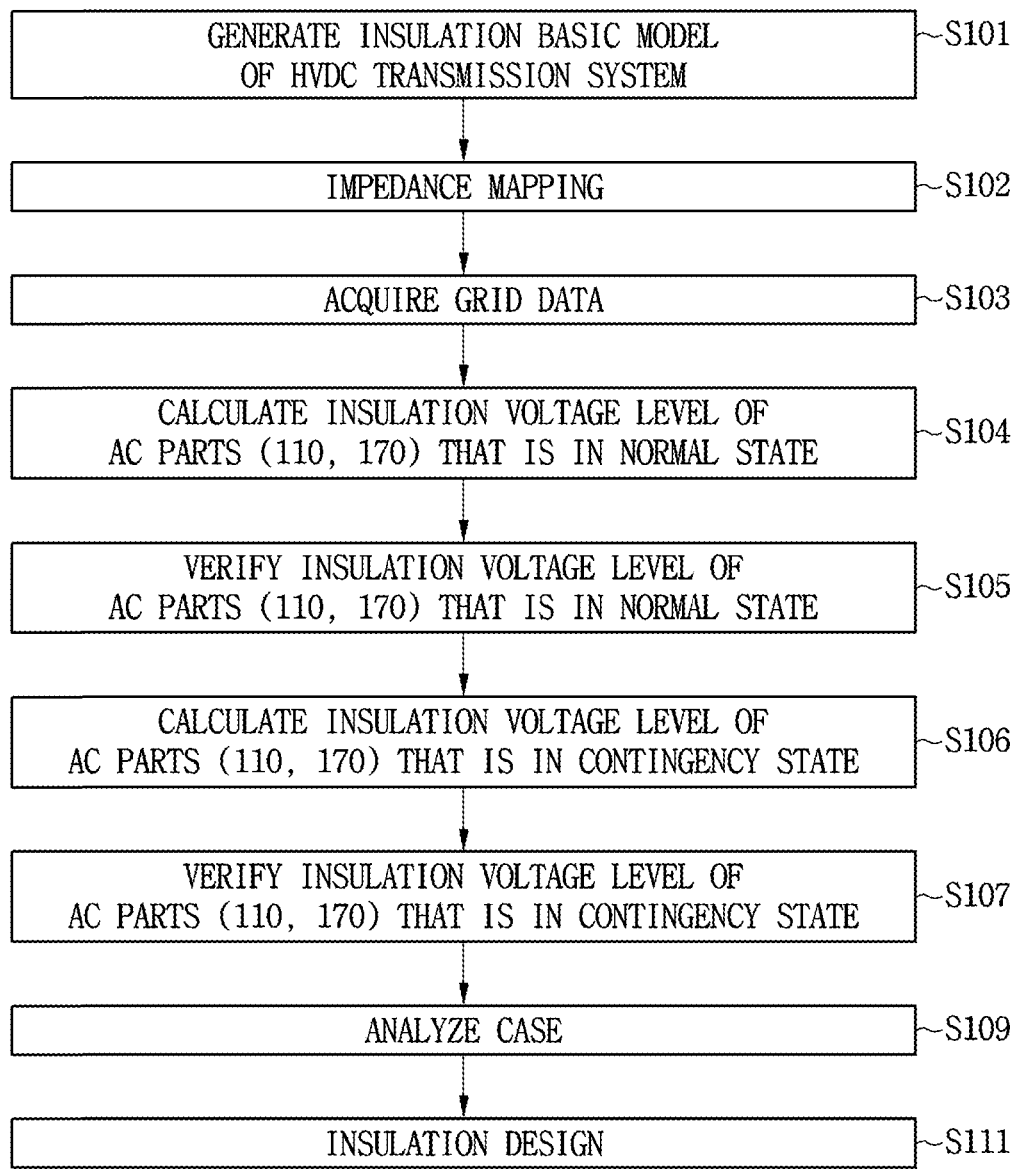

APPARATUS AND METHOD FOR INSULATION DESIGN OF HIGH VOLTAGE DIRECT CURRENT TRANSMISSION SYSTEM

CROSS-REFERENCE TO RELATED APPLICATIONS

Pursuant to 35 U.S.C. § 119(a), this application claims the benefit of earlier filing date and right of priority to Korean Patent Application No. 10-2014-0057376, filed on May 13, 2014, the contents of which are hereby incorporated by reference herein in its entirety.

BACKGROUND

The present disclosure relates to a high voltage direct current (HVDC) transmission system. Particularly, the present disclosure relates to a method for an insulation design of an HVDC transmission system.

The HVDC transmission system may convey electricity to a far distance through high voltage DC.

In general, the HVDC transmission system may transmit electricity by using an overhead line or submarine cable.

The HVDC transmission system is being widely used due to advantages such as less investment costs, unlimited cable length, and less power transmission loss.

Since the HVDC transmission system conveys electricity through the high voltage DC, importance of an insulation design is high.

In the insulation design of the HVDC transmission system according to the related art, since only a self-overvoltage level of the HVDC transmission system is considered without considering an AC system, instability of the AC system may have an influence on the HVDC transmission system.

SUMMARY

Embodiments provide an apparatus and method of an insulation design, which performs an insulation design of an HVDC transmission system in consideration of instability of an AC system.

In one embodiment, an apparatus for an insulation design, which performs the insulation design of a high voltage direct current (HVDC) transmission system includes: a contingency state voltage calculation unit calculating an insulation voltage level of an AC part of the HVDC transmission system, which is in a contingency state, on the basis of grid data of an insulation basic model of the HVDC transmission system; a case analysis performance unit performing a case analysis by using the insulation voltage level of the AC part of the HVDC transmission system, which is in the contingency state, to calculate a maximum insulation voltage level; and a rated insulation level calculation unit applying the maximum insulation voltage level to the insulation basic model of the HVDC transmission system and performing the insulation design on the insulation basic model to which the maximum insulation voltage level is applied to calculate a rated insulation level of the HVDC transmission system.

The details of one or more embodiments are set forth in the accompanying drawings and the description below. Other features will be apparent from the description and drawings, and from the claims.

BRIEF DESCRIPTION OF THE DRAWINGS

FIG. 6 is a flowchart illustrating an operation method of the insulation design apparatus of the HVDC transmission system according to an embodiment.

DETAILED DESCRIPTION OF THE EMBODIMENTS

Reference will now be made in detail to the embodiments of the present disclosure, examples of which are illustrated in the accompanying drawings.

An electric device for an electric vehicle according to an embodiment will be described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

Hereinafter, embodiments of the present disclosure will be described in more detail with reference to the accompanying drawings. Furthermore, terms, such as a "part", a "module" ad a "unit", are used for convenience of description, and they do not have different meanings or functions in themselves.

Figure 1:
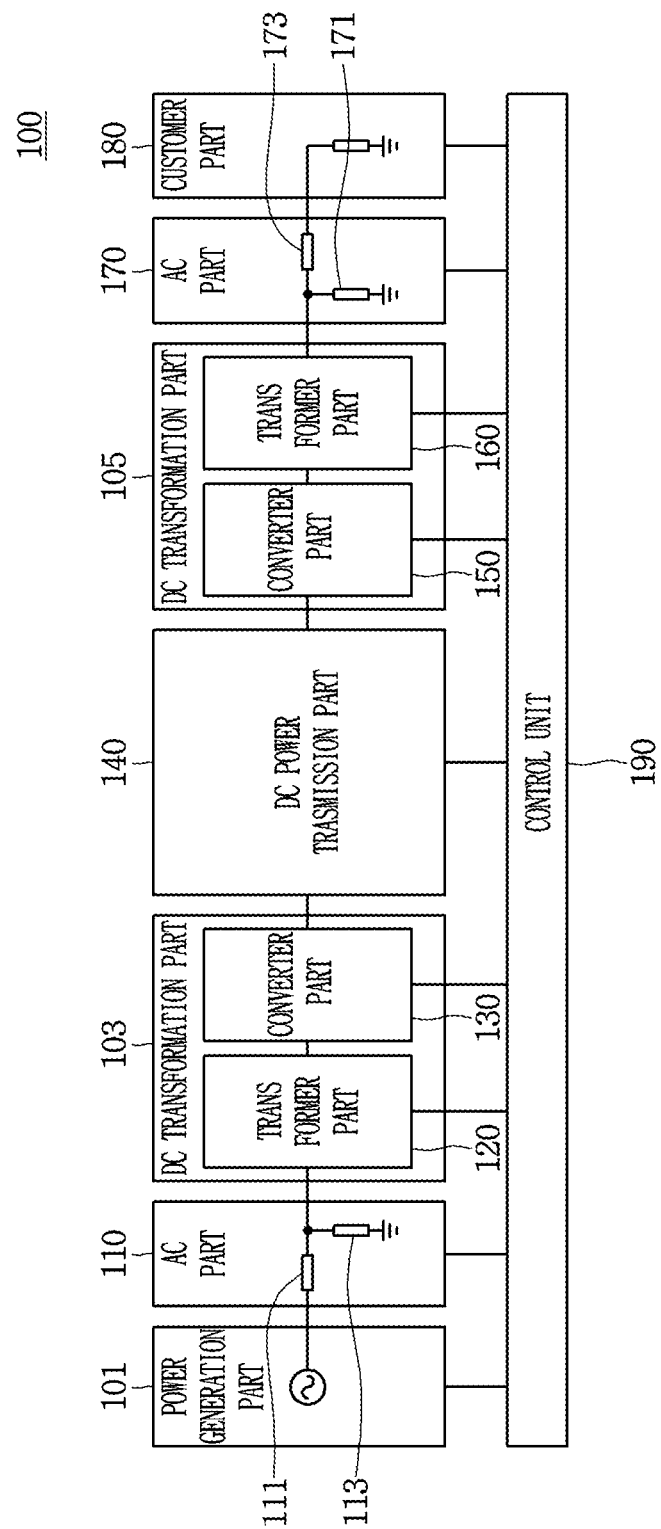
FIG. 1 is a view of a high voltage direct current (HVDC) transmission system according to an embodiment.

FIG. 1 is a view of a high voltage direct current (HVDC) transmission system according to an embodiment.

Referring to FIG. 1, an HVDC transmission system 100 according to an embodiment includes a power generation part 101, a transmission-side alternating current (AC) part 110, a transmission-side transformation part 103, a direct current (DC) power transmission part 140, a customer-side DC transformation part 105, a customer-side AC part 170, a customer part 180, and a control part 190. The transmission-side DC transformation part 103 includes a transmission-side transformer part 120, and a transmission-side AC-DC converter part 130. The customer-side DC transformation part 105 includes a customer-side DC-AC converter part 150, and a customer-side transformer part 160.

The power generation part 101 generates a three-phase AC power. The power generation part 101 may include a plurality of power generating plants.

The transmission-side AC part 110 transmits the three-phase AC power generated by the generation part 101 to a DC power transformation substation including the transmission-side transformer part 120 and the transmission-side AC-DC converter part 130.

The transmission-side transformer part 110 isolates the transmission-side AC part 110 from the transmission-side AC-DC converter part 130 and the DC power transmission part 140.

The transmission-side AC-DC converter part 130 converts the three-phase AC power corresponding to an output of the transmission-side transformer part 120 into a DC power.

The DC power transmission part 140 transfers the transmission-side DC power to a customer-side.

The customer-side DC-AC converter part 150 converts the DC power transmitted by the DC power transmission part 140 into a three-phase AC power.

The customer-side transformer part 160 isolates the customer-side AC part 170 from the customer-side DC-AC converter part 150 and the DC power transmission part 140.

The customer-side AC part 170 provides the three-phase AC power corresponding to an output of the customer-side transformer part 160 to the customer part 180.

The control part 190 controls at least one of the power generation part 101, the transmission-side AC part 110, the transmission-side DC transformation part 103, the DC power transmission part 140, the customer-side DC transformation part 105, the customer-side AC part 170, the customer part 180, the transmission-side AC-DC converter part 130, and the customer-side DC-AC converter part 150. Particularly, the control part 190 may control turn-on and turn-off timings of a plurality of valves within the transmission-side AC-DC converter part 130 and the customer-side DC-AC converter part 150. Here, each of the valves may be a thyristor or an insulated gate bipolar transistor (IGBT).

Figure 2:
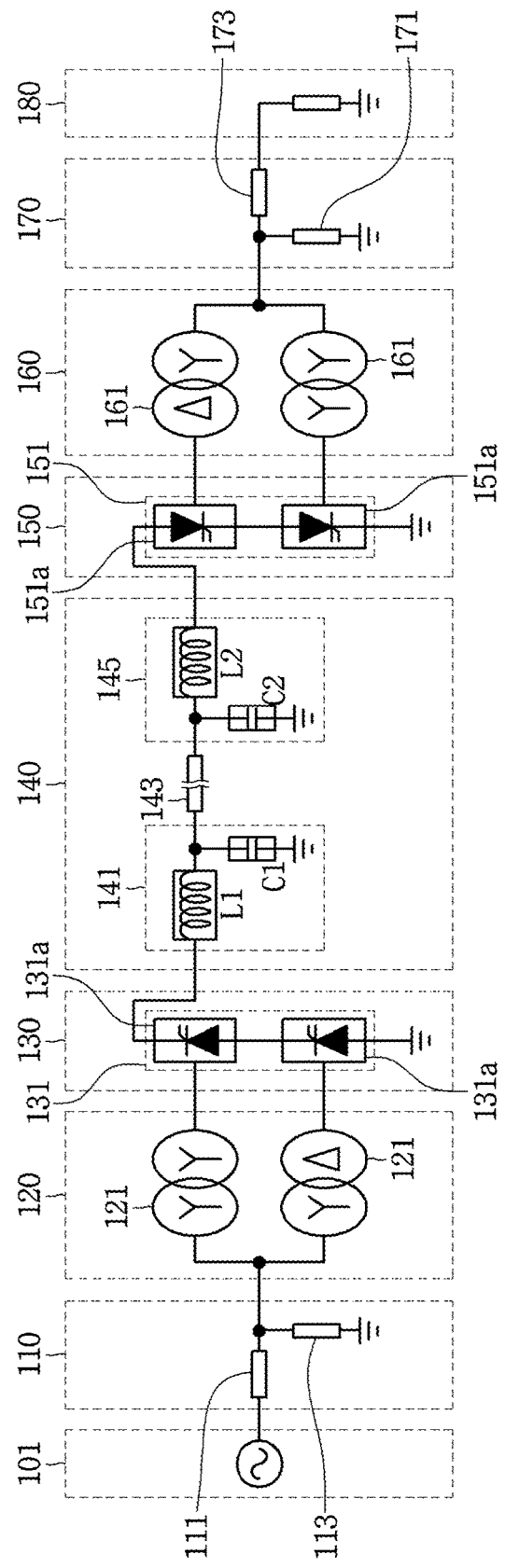
FIG. 2 is a view of a monopolar-type HVDC transmission system according to an embodiment.

FIG. 2 is a view of a monopolar-type HVDC transmission system according to an embodiment.

Particularly, FIG. 2 illustrates a system that transmits a DC power having a single pole. Hereinafter, it is assumed that the single pole is a positive pole, but is not limited thereto.

The transmission-side AC part 110 includes an AC transmission line 111 and an AC filter 113.

The AC power transmission line 111 transmits the three-phase AC power generated by the generation part 101 to the transmission-side DC transformation part 103.

The AC filter 113 removes remaining frequency components except for a frequency component that is used by the DC transformation part 103 from the transferred three-phase AC power.

The transmission-side transformer part 120 includes at least one transformer 121 for the positive pole. For the positive pole, the transmission-side AC-DC converter part 130 includes an AC-positive pole DC converter 131 that generates a positive pole DC power, and the AC-positive pole DC converter 131 includes at least one three-phase valve bridge 131a corresponding to the at least one transformer 121.

When one three-phase valve bridge 131a is used for the positive pole, the AC-positive pole DC converter 131 may generate a positive pole DC power having 6 pulses by using the AC power. Here, a primary coil and a secondary coil of one transformer 121 may have Y-Y connection or Y-Δ connection.

When two three-phase valve bridges 131a are used, the AC-positive pole DC converter 131 may generate a positive pole DC power having 12 pulses by using the AC power. Here, a primary coil and a secondary coil of one of the two transformers 121 may have Y-Y connection, and a primary coil and a secondary coil of the other of the two transformers 121 may have Y-Δ connection.

When three three-phase valve bridges 131a are used, the AC-positive pole DC converter 131 may generate a positive pole DC power having 18 pulses by using the AC power. The more the number of pulses of the positive pole DC power increases, the more a filter price may decrease.

The DC power transmission part 140 includes a transmission-side positive pole DC filter 141, a positive pole DC power transmission line 143, and a customer-side positive pole DC filter 145.

The transmission-side positive pole DC filter 141 includes an inductor L1 and a capacitor C1 and performs DC filtering on the positive pole DC power output by the AC-positive pole DC converter 131.

The positive pole DC power transmission line 143 has one DC line for transmitting the positive pole DC power, and the earth may be used as a current feedback path. At least one switch may be disposed on the DC line.

The customer-side negative pole DC filter 145 includes an inductor L2 and a capacitor C2 and performs DC filtering on the positive pole DC power transferred through the positive pole DC power transmission line 143.

The customer-side DC-AC converter part 150 includes a positive pole DC-AC converter 151 and at least one three-phase valve bridge 151a.

The customer-side transformer part 160 includes, for the positive pole, at least one transformer 161 corresponding to at least one three-phase valve bridge 151a.

When one three-phase valve bridge 151a is used, the positive pole DC-AC converter 151 may generate an AC power having 6 pulses by using the positive pole DC power. Here, a primary coil and a secondary coil of one transformer 161 may have Y-Y connection or Y-Δ connection.

When two three-phase valve bridges 151a are used, the positive pole DC-AC converter 151 may generate an AC power having 12 pulses by using the positive pole DC power. Here, a primary coil and a secondary coil of one of the two transformers 161 may have Y-Y connection, and a primary coil and a secondary coil of the other of the two transformers 161 may have Y-Δ connection.

When three three-phase valve bridges 151a are used, the positive pole DC-AC converter 151 may generate an AC power having 18 pulses by using the positive pole DC power. The more the number of pulses of the AC power increases, the more the filter price may decrease.

The customer-side AC part 170 includes an AC filter 171 and an AC power transmission line 173.

The AC filter 171 removes remaining frequency components except for a frequency component (for example, 60 Hz) used by the customer part 180 from the AC power generated by the customer-side DC transformation part 105.

The AC power transmission line 173 transmits the filtered AC power to the customer part 180.

Figure 3:
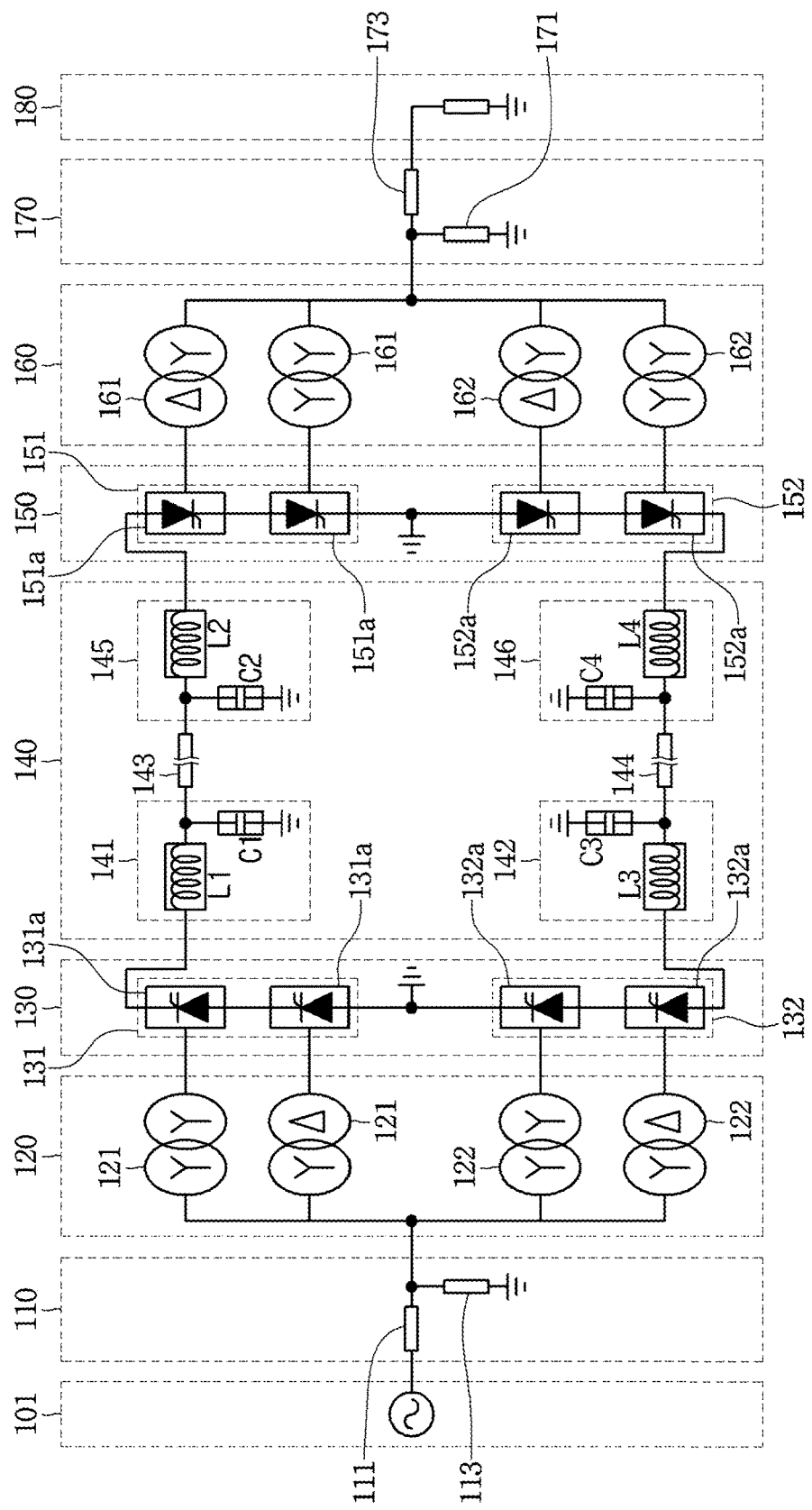
FIG. 3 is a view of a bipolar-type HVDC transmission system according to an embodiment.

FIG. 3 is a view of a bipolar-type HVDC transmission system according to an embodiment.

Particularly, FIG. 3 illustrates a system that transmits a DC power having two poles. Hereinafter, it is assumed that the two poles are a positive pole and a negative pole, but is not limited thereto.

The transmission-side AC part 110 includes an AC transmission line 111 and an AC filter 113.

The AC power transmission line 111 transmits the three-phase AC power generated by the generation part 101 to the transmission-side transformation part 103.

The AC filter 113 removes remaining frequency components except for a frequency component used by the transformation part 103 from the transferred three-phase AC power.

The transmission-side transformer part 120 includes at least one transformer 121 for the positive pole and at least one transformer 122 for the negative pole. The transmission-side AC-DC converter part 130 includes an AC-positive pole DC converter 131 that generates a positive pole DC power and an AC-negative pole DC converter 132 that generates a negative pole DC power. The AC-positive pole DC converter 131 includes at least one three-phase valve bridge 131a corresponding to the at least one transformer 121 for the positive pole. The AC-negative pole DC converter 132 includes at least one three-phase valve bridge 132a corresponding to the at least one transformer 122 for the negative pole.

When one three-phase valve bridge 131a is used for the positive pole, the AC-positive pole DC converter 131 may generate a positive pole DC power having 6 pulses by using the AC power. Here, a primary coil and a secondary coil of one transformer 121 may have Y-Y connection or Y-Δ connection.

When two three-phase valve bridges 131a are used for the positive pole, the AC-positive pole DC converter 131 may generate a positive pole DC power having 12 pulses by using the AC power. Here, a primary coil and a secondary coil of one of the two transformers 121 may have Y-Y connection, and a primary coil and a secondary coil of the other of the two transformers 121 may have Y-Δ connection.

When three three-phase valve bridges 131a are used for the positive pole, the AC-positive pole DC converter 131 may generate a positive pole DC power having 18 pulses by using the AC power. The more the number of pulses of the positive pole DC power increases, the more the filter price may decrease.

When one three-phase valve bridge 132a is used for the negative pole, the AC-negative pole DC converter 132 may generate a negative pole DC power having 6 pulses. Here, a primary coil and a secondary coil of one transformer 122 may have Y-Y connection or Y-Δ connection.

When two three-phase valve bridges 132a are used for the negative pole, the AC-negative pole DC converter 132 may generate a negative pole DC power having 12 pulses. Here, a primary coil and a secondary coil of one of the two transformers 122 may have Y-Y connection, and a primary coil and a secondary coil of the other of the two transformers 122 may have Y-Δ connection.

When three three-phase valve bridges 132a are used for the negative pole, the AC-negative pole DC converter 132 may generate a negative pole DC power having 18 pulses. The more the number of pulses of the negative pole DC power increases, the more the filter price may decrease.

The DC power transmission part 140 includes a transmission-side positive pole DC filter 141, a transmission-side negative pole DC filter 142, a positive pole DC power transmission line 143, a negative pole DC power transmission line 144, a customer-side positive pole DC filter 145, and a customer-side negative pole DC filter 146.

The transmission-side positive pole DC filter 141 includes an inductor L1 and a capacitor C1 and performs DC filtering on the positive pole DC power output by the AC-positive pole DC converter 131.

The transmission-side negative pole DC filter 142 includes an inductor L3 and a capacitor C3 and performs DC filtering on the negative pole DC power output by the AC-negative pole DC converter 132.

The positive pole DC power transmission line 143 has one DC line for transmitting the negative pole DC power, and the earth may be used as a current feedback path. At least one switch may be disposed on the DC line.

The negative pole DC power transmission line 144 has one DC line for transmitting the negative pole DC power, and the earth may be used as a current feedback path. At least one switch may be disposed on the DC line.

The customer-side negative pole DC filter 145 includes an inductor L2 and a capacitor C2 and performs DC filtering on the positive pole DC power transferred through the positive pole DC power transmission line 143.

The customer-side negative pole DC filter 146 includes an inductor L4 and a capacitor C4 and performs DC filtering on the negative pole DC power transferred through the negative pole DC power transmission line 144.

The customer-side DC-AC converter part 150 includes a positive pole DC-AC converter 151 and a negative pole DC-AC converter 152. The positive pole DC-AC converter 151 includes at least one three-phase valve bridge 151a, and the negative pole DC-AC converter 152 includes at least one three-phase valve bridge 152a.

The customer-side transformer part 160 includes, for the positive pole, at least one transformer 161 corresponding to the at least one three-phase valve bridge 151a and, for the negative pole, at least one transformer 162 corresponding to the at least one three-phase valve bridge 152a.

When one three-phase valve bridge 151a is used for the positive pole, the positive pole DC-AC converter 151 may generate an AC power having 6 pulses by using the positive pole DC power. Here, a primary coil and a secondary coil of one transformer 161 may have Y-Y connection or Y-Δ connection.

When two three-phase valve bridges 151a are used for the positive pole, the positive pole DC-AC converter 151 may generate an AC power having 12 pulses by using the positive pole DC power. Here, a primary coil and a secondary coil of one of the two transformers 161 may have Y-Y connection, and a primary coil and a secondary coil of the other of the two transformers 161 may have Y-Δ connection.

When three three-phase valve bridges 151a are used for the positive pole, the positive pole DC-AC converter 151 may generate an AC power having 18 pulses by using the positive pole DC power. The more the number of pulses of the AC power increases, the more the filter price may decrease.

When one three-phase valve bridge 152a is used for the negative pole, the negative pole DC-AC converter 152 may generate an AC power having 6 pulses by using the negative pole DC power. Here, a primary coil and a secondary coil of one transformer 162 may have Y-Y connection or Y-Δ connection.

When two three-phase valve bridges 152a is used for the negative pole, the negative pole DC-AC converter 152 may generate an AC power having 12 pulses by using the negative pole DC power. Here, a primary coil and a secondary coil of one of the two transformers 162 may have Y-Y connection, and a primary coil and a secondary coil of the other of the two transformers 162 may have Y-Δ connection.

When three three-phase valve bridges 152a is used for the negative pole, the negative pole DC-AC converter 152 may generate an AC power having 18 pulses by using the negative pole DC power. The more the number of pulses of the AC power increases, the more the filter price may decrease.

The customer-side AC part 170 includes an AC filter 171 and an AC power transmission line 173.

The AC filter 171 removes remaining frequency components except for a frequency component (for example, 60 Hz) used by the customer part 180 from the AC power generated by the customer-side DC transformation part 105.

The AC power transmission line 173 transmits the filtered AC power to the customer part 180.

Figure 4:
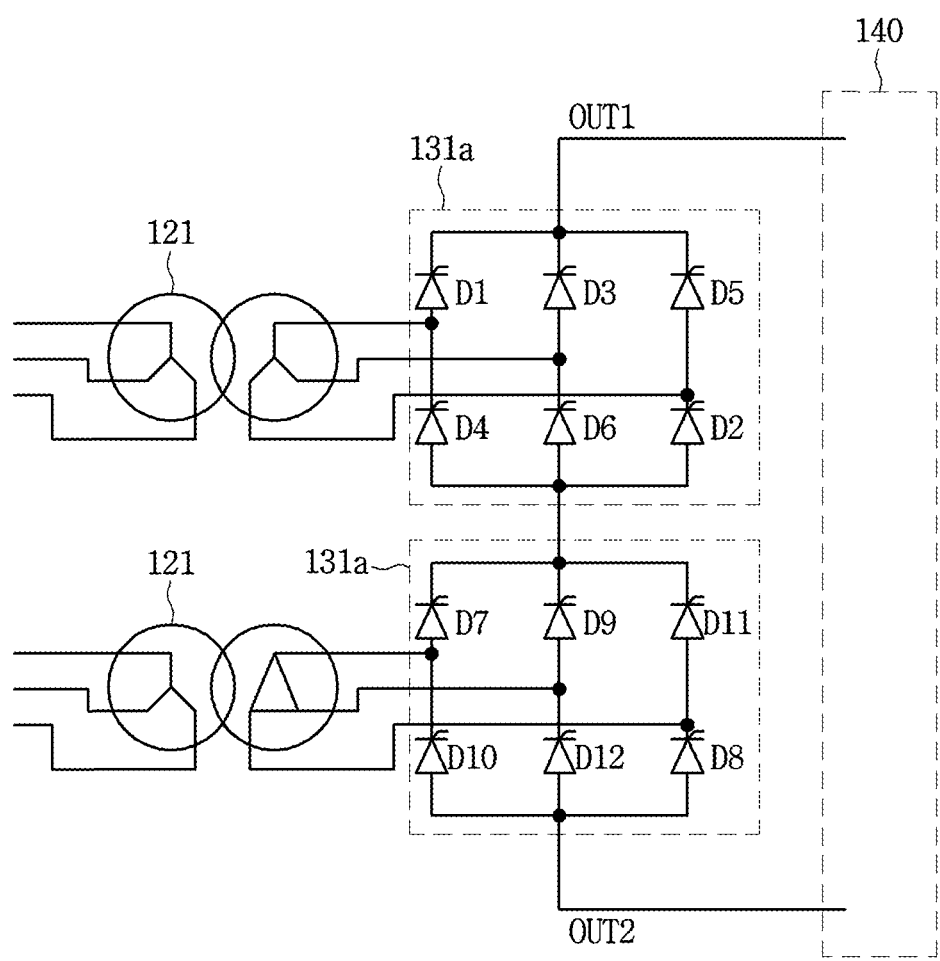
FIG. 4 is a view illustrating connection between a transformer and a three-phase valve bridge according to an embodiment.

FIG. 4 is a view illustrating connection between the transformer and the three-phase valve bridge according to an embodiment.

Particularly, FIG. 4 illustrates the connection between the two transformers 121 for the positive pole and the two three-phase valve bridges 131a for the positive pole. Since the connection between the two transformers 122 for the negative pole and the two three-phase valve bridges 132a for the negative pole, the connection between the two transformers 161 for the positive pole and the two three-phase valve bridges 151a for the positive pole, the connection between the two transformers 162 for the negative pole and the two three-phase valve bridges 152a for the negative pole, the connection between the one transformer 121 for the positive pole and the one three-phase valve bridge 131a for the positive pole, and the connection between the one transformer 161 for the positive pole and the one three-phase valve bridge 151a for the positive pole could be easily derived from the embodiment of FIG. 4, their drawings and descriptions thereof will be omitted.

In FIG. 4, the transformer 121 having the Y-Y connection is called an upper transformer, the transformer 121 having the Y-Δ connection is called a lower transformer, the three-phase valve bridge 131a connected to the upper transformer is called an upper three-phase valve bridges, and the three-phase valve bridges 131a connected to the lower transformer is called a lower three-phase valve bridges.

The upper three-phase valve bridges and the lower three-phase valve bridges have two output terminals outputting a DC power, i.e., a first output terminal OUT1 and a second output terminal OUT2.

The upper three-phase valve bridge includes six valves D1 to D6, and the lower three-phase valve bridges include six valves D7 to D12.

The valve D1 has a cathode connected to the first output terminal OUT1 and an anode connected to a second terminal of the secondary coil of the upper transformer.

The valve D2 has a cathode connected to the anode of the valve D5 and an anode connected to the anode of the valve D6.

The valve D3 has a cathode connected to the first output terminal OUT1 and an anode connected to a second terminal of the secondary coil of the upper transformer.

The valve D4 has a cathode connected to the anode of the valve D1 and an anode connected to the anode of the valve D6.

The valve D5 has a cathode connected to the first output terminal OUT1 and an anode connected to a third terminal of the secondary coil of the upper transformer.

The valve D6 has a cathode connected to the anode of the valve D3.

The valve D7 has a cathode connected to the anode of the valve D6 and an anode connected to a first terminal of the secondary coil of the lower transformer.

The valve D8 has a cathode connected to the anode of the valve D11 and an anode connected to a second output terminal OUT2.

The valve D9 has a cathode connected to the anode of the valve D6 and an anode connected to a second terminal of the secondary coil of the lower transformer.

The valve D10 has a cathode connected to the anode of the valve D7 and an anode connected to the second output terminal OUT2.

The valve D11 has a cathode connected to the anode of the valve D6 and an anode connected to a third terminal of the secondary coil of the lower transformer.

The valve D12 has a cathode connected to the anode of the valve D9 and an anode connected to the second output terminal OUT2.

A method for an insulation design of the HVDC transmission system will be described with reference to FIGS. 5 and 6.

Figure 5:
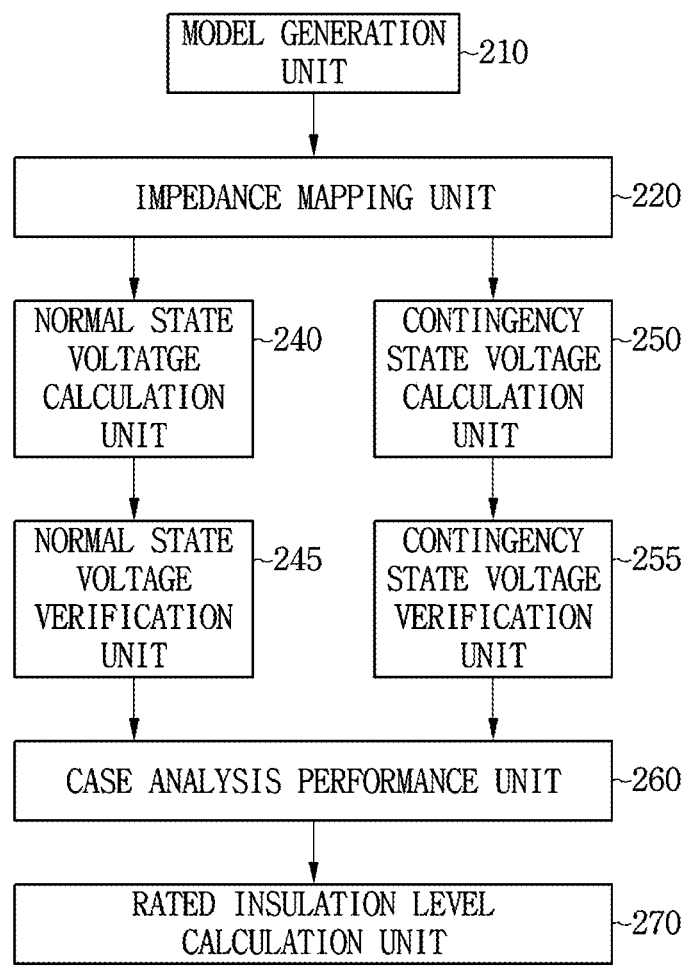
FIG. 5 is a block diagram illustrating an apparatus for an insulation design of the HVDC transmission system according to an embodiment.

FIG. 5 is a block diagram illustrating an apparatus for an insulation design of the HVDC transmission system according to an embodiment.

Referring to FIG. 5, an HVDC transmission system 200 according to an embodiment includes a model generation unit 210, an impedance mapping unit 220, a normal state voltage calculation unit 240, a normal state voltage verification unit 245, a contingency state voltage calculation unit 250, a contingency state voltage verification unit 255, a case analysis performance unit 260, and a rated insulation level calculation unit 270.

The model generation unit 210 may model the HVDC transmission system 100 to generate an insulation basic model of the HVDC transmission system 100.

The impedance mapping unit 220 performs impedance mapping of AC parts 110 and 170 of the insulation basic model of the HVDC transmission system 100 in operation S103 to acquire grid data of the insulation basic model of the HVDC transmission system 100.

The normal state voltage calculation unit 240 calculates an insulation voltage level of the AC parts 110 and 170 that are in a normal state on the basis of the grid data of the insulation basic model of the HVDC transmission system 100.

The normal state voltage verification unit 245 verifies the calculated insulation voltage level of the AC parts 110 and 170 that are in the normal state.

The contingency state voltage calculation unit 250 calculates insulation voltage levels of the AC parts 110 and 170 that are in a contingency state on the basis of the grid data of the insulation basic model of the HVDC transmission system 100.

The contingency state voltage verification unit 255 verifies the calculated insulation voltage levels of the AC parts 110 and 170 that are in the contingency state.

The case analysis performance unit 260 performs a case analysis by using the verified insulation voltage levels of the AC parts 110 and 170 that are the normal state and the verified insulation voltage levels of the AC parts 110 and 170 that are the contingency state to calculate a maximum insulation voltage level.

The rated insulation level calculation unit 270 applies the maximum insulation voltage level to the insulation basic model of the HVDC transmission system 100 and performs the insulation design on the insulation basic model to which the maximum insulation voltage level is applied to calculate a rated insulation level of the HVDC transmission system 100.

The contingency may represent an accident that is contingent for evaluating an aspect of safety of the HVDC transmission system 100 or the AC parts 110 and 170 of the HVDC transmission system 100.

FIG. 6 is a flowchart illustrating an operation method of the insulation design device of the HVDC transmission system according to an embodiment.

The model generation unit 210 may model the HVDC transmission system 100 to generate an insulation basic model of the HVDC transmission system 100 in operation S101.

The impedance mapping unit 220 performs impedance mapping of AC parts 110 and 170 of the insulation basic model of the HVDC transmission system 100 in operation S103 to acquire grid data of the insulation basic model of the HVDC transmission system 100 in operation S105.

The normal state voltage calculation unit 240 calculates an insulation voltage level of the AC parts 110 and 170 that are in a normal state on the basis of the grid data of the insulation basic model of the HVDC transmission system 100 in operation S107. Particularly, the normal state voltage calculation unit 240 may calculate an insulation voltage level according to a variation in grid impedance of the AC parts 110 and 170 that are in the normal state. More particularly, the normal state voltage calculation unit 240 may calculate an insulation voltage level according to a variation in voltage and grid impedance of the AC parts 110 and 170 that are in the normal state.

The normal state voltage verification unit 245 verifies the calculated insulation voltage level of the AC parts 110 and 170 that are in the normal state in operation S109. Here, the normal state voltage verification unit 245 verifies power stability of the calculated insulation voltage level of the AC parts 110 and 170 that are in the normal state. Particularly, the normal state voltage verification unit 245 may use software that is called a power system simulator for engineering (PSS/E).

The contingency state voltage calculation unit 250 calculates insulation voltage levels of the AC parts 110 and 170 that are in a contingency state on the basis of the grid data of the insulation basic model of the HVDC transmission system 100 in operation S111. Particularly, the contingency state voltage calculation unit 250 may calculate an insulation voltage level according to a variation in grid impedance of the AC parts 110 and 170 that are in the contingency state. More particularly, the contingency state voltage calculation unit 250 may calculate an insulation voltage level according to a variation in voltage and grid impedance of the AC parts 110 and 170 that are in the contingency state.

The contingency state voltage verification unit 255 verifies the calculated insulation voltage levels of the AC parts 110 and 170 that are in the contingency state in operation S113. Here, the contingency state voltage verification unit 255 verifies power stability of the calculated insulation voltage level of the AC parts 110 and 170 that are in the contingency state. Particularly, the contingency state voltage verification unit 255 may use software that is called a power system simulator for engineering (PSS/E).

The case analysis performance unit 260 performs a case analysis by using the verified insulation voltage levels of the AC parts 110 and 170 that are the normal state and the verified insulation voltage levels of the AC parts 110 and 170 that are the contingency state to calculate a maximum insulation voltage level in operation S115. Here, the case analysis performance unit 260 may additionally calculate grid impedance for the maximum insulation voltage level.

The rated insulation level calculation unit 270 applies the maximum insulation voltage level to the insulation basic model of the HVDC transmission system 100 and performs the insulation design on the insulation basic model to which the maximum insulation voltage level is applied to calculate a rated insulation level of the HVDC transmission system 100 in operation S117. Here, the rated insulation level calculation unit 270 may additionally apply the grid impedance for the maximum insulation voltage level to the insulation basic model of the HVDC transmission system 100 to perform the insulation design. Here, the rated insulation level may include a voltage value and distance value at at least one position of the HVDC transmission system 100.

According to the embodiment, the above-described method can also be embodied as processor readable codes on a processor readable recording medium. Examples of the processor readable recording medium include read-only memory (ROM), random-access memory (RAM), CD-ROMs, magnetic tapes, floppy disks, optical data storage devices, and carrier waves (such as data transmission through the Internet).

Also, the embodiments set forth therein is not so limitedly, but all or part of the embodiments can be selectively combined so as to derive many variations.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for insulation design of a high voltage direct current (HVDC) transmission system, the apparatus comprising:
   a contingency state voltage calculation unit calculating a first insulation voltage level according to a variation in grid impedance of an AC part of the HVDC transmission system based on grid data of an insulation basic model of the HVDC transmission system when the HVDC transmission system is in a contingency state;
   a case analysis performance unit using the calculated first insulation voltage level to perform a case analysis of the HVDC transmission system in the contingency state in order to calculate a maximum insulation voltage level; and
   a rated insulation level calculation unit applying the calculated maximum insulation voltage level to the insulation basic model and performing the insulation design on the insulation basic model to which the calculated maximum insulation voltage level is applied in order to calculate a rated insulation level of the HVDC transmission system.

2. The apparatus according to claim 1, further comprising a normal state voltage calculation unit calculating a second insulation voltage level of the AC part of the HVDC transmission system when the HVDC transmission system is in a normal state based on the grid data of the insulation basic model,
   wherein the case analysis performance unit further uses the calculated second insulation voltage and the calculated first insulation voltage level to perform the case analysis.

3. The apparatus according to claim 2, wherein the normal state voltage calculation unit further calculates the second insulation voltage level according to a variation in grid impedance of the AC part of the HVDC transmission system in the normal state.

4. The apparatus according to claim 3, wherein the normal state voltage calculation unit further calculates the second insulation voltage level according to a variation in voltage and grid impedance of the AC part of the HVDC transmission system in the normal state; and
   the contingency state voltage calculation unit further calculates the first insulation voltage level according to a variation in voltage and grid impedance of the AC part of the HVDC transmission system in the contingency state.

5. The apparatus according to claim 4, further comprising:
a normal state voltage verification unit verifying the calculated second insulation voltage level; and
a contingency state voltage verification unit verifying the calculated first insulation voltage level,
wherein the case analysis performance unit further uses the verified second insulation voltage level and the verified first insulation voltage level to perform the case analysis.

6. The apparatus according to claim 1, further comprising:
a model generation unit modeling the HVDC transmission system to generate the insulation basic model; and
an impedance mapping unit performing impedance mapping of the insulation basic model to acquire the grid data.

7. The apparatus according to claim 1, wherein:
the case analysis performance unit further uses the calculated first insulation voltage level to calculate grid impedance for the calculated maximum insulation voltage level; and
the rated insulation level calculation unit further applies the calculated grid impedance to the insulation basic model.

8. The apparatus according to claim 1, wherein the calculated rated insulation level comprises a voltage value and distance value at at least one position of the HVDC transmission system.

9. An apparatus for insulation design of a high voltage direct current (HVDC) transmission system, the apparatus comprising:
a contingency state voltage calculation unit calculating a first insulation voltage level according to a variation in grid impedance of an AC part of the HVDC transmission system based on grid data of an insulation basic model of the HVDC transmission system when the HVDC transmission system is in a contingency state;
a case analysis performance unit using the calculated first insulation voltage level to perform a case analysis of the HVDC transmission system in the contingency state in order to calculate a maximum insulation voltage level;
a rated insulation level calculation unit applying the calculated maximum insulation voltage level to the insulation basic model and performing the insulation design on the insulation basic model to which the calculated maximum insulation voltage level is applied in order to calculate a rated insulation level of the HVDC transmission system;
a normal state voltage calculation unit calculating a second insulation voltage level of the AC part of the HVDC transmission system when the HVDC transmission system is in a normal state based on the grid data of the insulation basic model,
wherein the case analysis performance unit further uses the calculated second insulation voltage and the calculated first insulation voltage level to perform the case analysis,
wherein the normal state voltage calculation unit further calculates the second insulation voltage level according to a variation in grid impedance of the AC part of the HVDC transmission system in the normal state,
wherein the normal state voltage calculation unit further calculates the second insulation voltage level according to a variation in voltage and grid impedance of the AC part of the HVDC transmission system in the normal state, and
wherein the contingency state voltage calculation unit further calculates the first insulation voltage level according to a variation in voltage and grid impedance of the AC part of the HVDC transmission system in the contingency state;
a normal state voltage verification unit verifying the calculated second insulation voltage level; and
a contingency state voltage verification unit verifying the calculated first insulation voltage level,
wherein the case analysis performance unit further uses the verified second insulation voltage level and the verified first insulation voltage level to perform the case analysis,
wherein the normal state voltage verification unit further verifies power stability of the calculated second insulation voltage level, and
wherein the contingency state voltage verification unit further verifies power stability of the calculated first insulation voltage level.

10. The apparatus according to claim 9, wherein each of the normal state voltage verification unit and the contingency state voltage verification unit utilizes a power system simulator for engineering (PSS/E) software.

* * * * *